United States Patent [19]
Mok et al.

[11] Patent Number: 6,057,703
[45] Date of Patent: May 2, 2000

[54] RECONFIGURABLE PROGRAMMABLE LOGIC DEVICES

[75] Inventors: Fai Mok, West Hills; Jean-Jacques P. Drolet; Demetri Psaltis, both of Pasadena, all of Calif.

[73] Assignee: Holoplex Inc., Pasadena, Calif.

[21] Appl. No.: 08/916,843

[22] Filed: Aug. 22, 1997

[51] Int. Cl.$^7$ .............................. G06F 7/38; H03K 19/177
[52] U.S. Cl. ................. 326/38; 326/38; 326/39; 326/40; 326/41; 250/208.1
[58] Field of Search .................. 326/38, 39, 40, 326/41; 250/208.1

[56] References Cited

U.S. PATENT DOCUMENTS

| | | | |
|---|---|---|---|
| 5,511,058 | 4/1996 | Visel et al. | 369/103 |
| 5,760,607 | 6/1998 | Leeds et al. | 326/38 |
| 5,781,031 | 7/1998 | Bertin et al. | 326/39 |
| 5,847,577 | 12/1998 | Trimberger | 326/38 |
| 5,859,544 | 1/1999 | Norman | 326/40 |

OTHER PUBLICATIONS

Drolet, Jean–Jacques P., et al., "Integrated Optoelectronic Interconnects Using Liquid–Crystal–on Silicon VLSI," *SPIE Proceedings CR62: Optoelectronic Interconnects and Packaging*, Jan. 1996, pp. 106–131.

Xilinx, "The Programmable Logic Data Book," pp. 1–3— 1–5, 4–5—4–7, 4–11—4–15, 4–32—4–35, ©1996.

*Primary Examiner*—Michael Tokar
*Assistant Examiner*—Vibol Tan
*Attorney, Agent, or Firm*—Fliesler, Dubb, Meyer & Lovejoy LLP

[57] ABSTRACT

Methods and apparatus to reconfigure a programmable logic device on a chip. The device includes a number of configurable elements. The methods include the steps of retrieving reconfiguration data pre-stored in a memory device located apart from the chip, and transferring the retrieved reconfiguration data in parallel to each of the configurable elements. One approach pre-stores the data in holograms.

21 Claims, 4 Drawing Sheets

RECONFIGURABLE PROGRAMMABLE LOGIC DEVICES

This invention was made with Government support under DAAH01-97-C-R281 awarded by the Department of the Army, U.S. Army Missile Command. The Government has certain rights in the invention.

BACKGROUND OF THE INVENTION

The present invention relates generally to programmable logic devices, and more particularly to methods and apparatus to reconfigure programmable logic devices, Programmable logic devices (PLDs) are gaining popularity as powerful reconfigurable digital circuits. Compared to general purpose microprocessors, they are much faster because they can be tailored to specific tasks. Compared to application specific integrated circuits, PLDs need much less non-recurring engineering cost to implement a design; they also provide faster turnaround for rapid product prototyping and initial or small-volume production.

One type of PLDs that can be programmed by a user is the field programmable gate arrays (FPGA) as illustrated in FIG. 1. An FPGA is typically made up of numerous cells or logic blocks. Each cell includes rewritable configuration memories to program or reconfigure the cell for different tasks, such as adding and subtracting. Reconfiguration is typically done by loading different configuration data into the rewritable configuration memories in each cell. Reconfiguration is not limited to the cells. Interconnects among the cells are also reconfigurable. In this application, both the logic elements in a cell and the interconnects among the cells that can be reconfigurable are known as configurable elements.

In a conventional FPGA, reconfiguration data are loaded into configuration memories serially through shift register elements, with one shift register element controlling the content of a configuration memory unit. To reconfigure the FPGA chip, the data are shifted in serially, one bit at a time, into the shift register elements, and then loaded into the configuration memory units.

One representation of the reconfiguration data is a reconfiguration page. Each page includes information for an entire chip. A page can include 100K bits, with each bit controlling a configuration memory unit for updating one configurable element in an FPGA. Data transfer for such a page of data can take more than a second, and has to be done every time the FPGA is powered up. For numerous applications, reconfiguration data are transferred eve n during normal system operation so as to reconfigure each cell for different tasks on the fly. Thus, to increase the operation speed of FPGAs, reconfiguration time or the time to transfer reconfigurition data to FPGAs should be minimized.

One approach to reduce the reconfiguration time is to increase the width of the bus carrying the reconfiguration data to the shift register elements. With a wider bus, instead of shifting a bit at a time, byte-sized words are transferred. The reconfiguration time is thus reduced based on the width of the bus. However, data with each unit being one or more byte-sized words still have to be transferred serially into the chip.

Another approach to reduce the reconfiguration time is to pre-store reconfiguration data in the chip. For example, pages of reconfiguration data can be pre-stored in on-chip memory, with an on-chip pointer selecting the appropriate configuration page for the configurable elements during data transfer. A FPGA could then be reprogrammed, or reconfigured, simply by writing a new value to this pointer. However, because of silicon area limitations, such a FPGA can only store a limited number of configuration pages. One existing FPGA using this approach has significantly reduced the reconfiguration time, but only for eight configuration pages stored or chip and with 100K bits per page. Additional configuration pages would have to be stored off chip and loaded onto the chip at the regular slower speed.

It should be apparent from the foregoing that there is still a need for methods and apparatus to reduce the reconfiguration time if there are large amount of reconfiguration data.

SUMMARY OF THE INVENTION

The present invention provides methods and apparatus to significantly increase the speed to reconfigure programmable logic devices even for large amount of reconfiguration data. To get around the silicon area limitation, instead of storing the reconfiguration data on-chip, data stored off-chip are transferred in parallel to each configurable element.

In one embodiment, a modified FPGA includes a number of detectors to receive reconfiguration data. During data transfer, all the reconfiguration data are mapped to the detectors simultaneously. The reconfiguration data are stored apart from the FPGA so the size of the FPGA does not have to increase to accommodate the storage of pages of reconfiguration data.

One way to transfer data is through optics, with each detector being an optical detector. The reconfiguration data are embedded in holograms, which are mapped onto the detectors during data transfer. The time required to load the data depends on the integration time needed for the detectors to achieve a signal-to-noise ratio to be above a threshold level. In one embodiment, with more than one hundred pages of reconfiguration data stored in holograms, and with about a million bits per page, the reconfiguration time using the present invention to transfer a page of reconfiguration data is just about 30 micro-seconds.

Other aspects and advantages of the present invention will become apparent from the following detailed description, which, when taken in conjunction with the accompanying drawings, illustrates by way of example the principles of the invention.

Same numerals in FIGS. 1–4 are assigned to similar elements in all the figures. Embodiments of the invention are discussed below with reference to FIGS. 1–4. However, those skilled in the art will readily appreciate that the detailed description given herein with respect to these figures is for explanatory purposes as the invention extends beyond these limited embodiments.

DETAILED DESCRIPTION OF THE INVENTION

Figure 1:
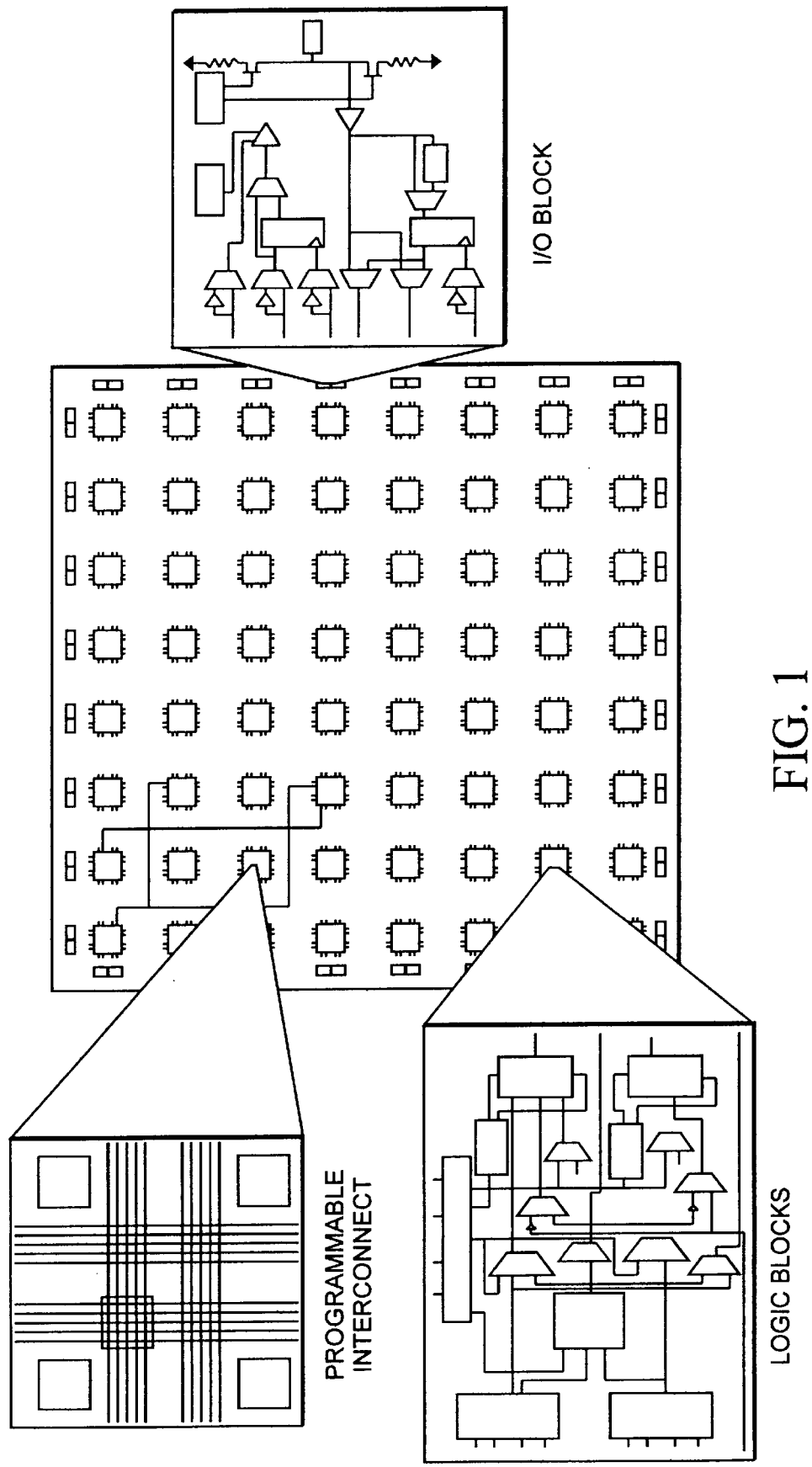
FIG. 1 shows a prior art field programmable gate array.
Figure 2:
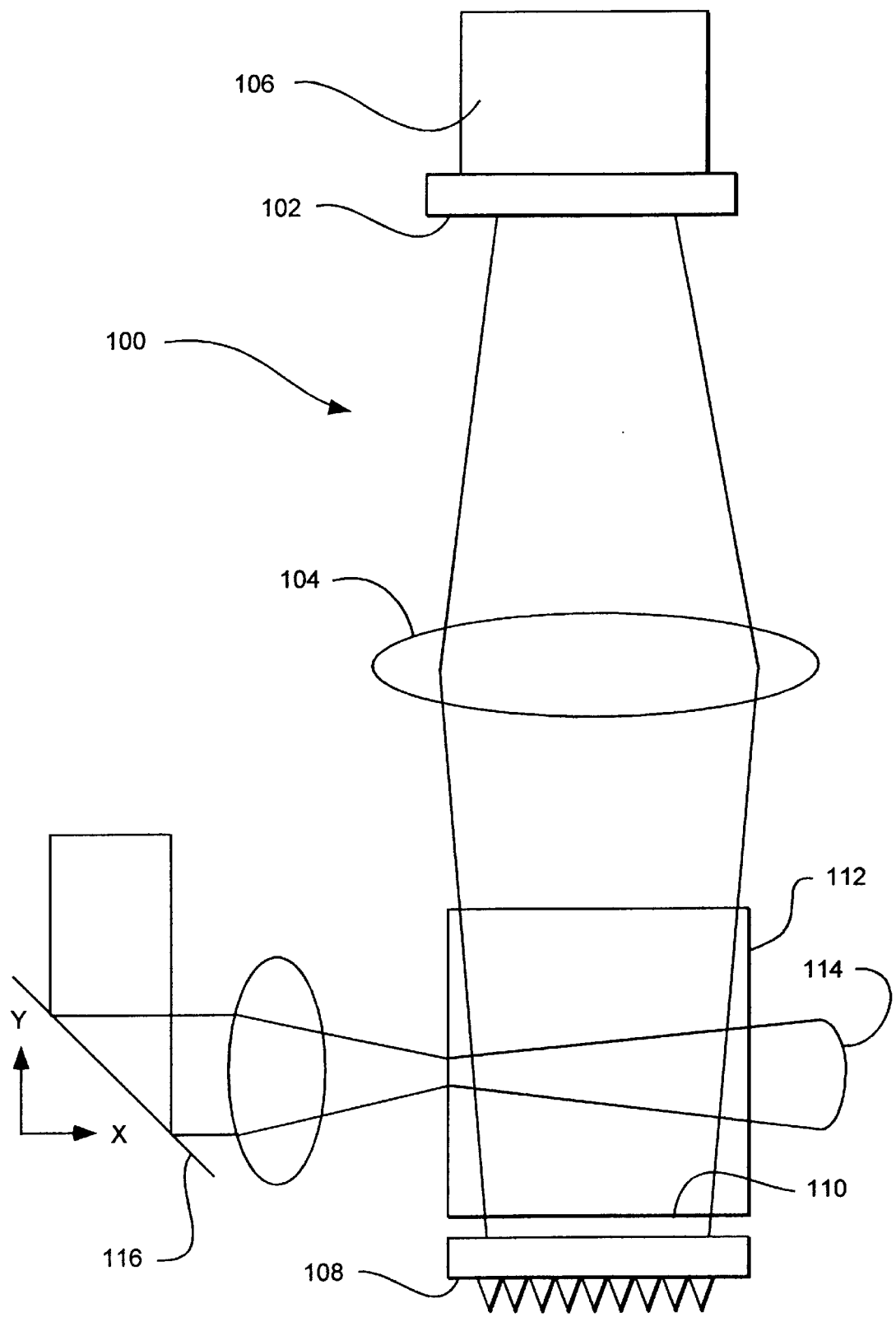
FIG. 2 illustrates one apparatus in the present invention storing configuration data as holograms.

FIG. 2 illustrates one apparatus 100 that stores configuration data as holograms. A page of configuration data is represented on a spatial light modulator (SLM) 102. Then an object beam 106 illuminates through the SLM 102, and is focused by a lens 104 onto the top surface 110 of an FPGA 108. The pixels of the SLM 102 are matched one-to-one with optical detectors incorporated on the FPGA. In one embodiment, an optical detector replaces every shift register element to control the content of configuration memory units on the chip. Instead of shift register elements transferring data into configuration memory units, optical detectors perform the talk. Fabrication of such detectors onto FPGAs should be obvious to those skilled in the art, and will rot be further described in this application.

A holographic medium 112, such as an infrared sensitive LiNbO3, is placed on top of the FPGA 108, with a spherical beam 114 as a reference to record the hologram. When the reference is a spherical beam, reconstruction becomes sensitive to the position of the reconstructing beam with respect to the position of the recording reference beam. Moving the position of the reference beam by a small amount can eliminate the reconstruction completely. This effect can be used to multiplex many holograms for pages of configuration data.

A new page of data is recorded for each new position of the reference beam 114. This can be done, for example, through moving the mirror 116 shown in FIG. 2 in the Y direction by a mechanical stage to translate the position of the reference beam. As an example, for a 1 cm thick LiNbO3 crystal, the distance that needs to be translated for the reference beam to record two pages can be as little as 5 microns. Therefore, to record 1,000 holograms, one only needs 5 mm transverse aperture at the focal plane of the spherical beams. In one embodiment, the aperture for the hologram is approximately 1 cm to allow for the expansion of the spherical waves.

In one embodiment, the recorded holograms are thermally fixed to prevent decay during read-out. Accomplishing such stability should be obvious to those skilled in the art and will not be further described in this application.

In another embodiment, the crystal 112 serves as a read-only memory for the FPGA 108. Then the sets of data for reconfiguration that need to be periodically reloaded into the FPGA 108 should be fixed and known a priori. Given a particular problem or application, the reconfiguration data to be stored as holograms can be pre-determined to set the desired holograms. The crystal 112 with the fixed holograms can then be integrated with the FPGA circuit 108 as shown in FIG. 3.

Figure 3:
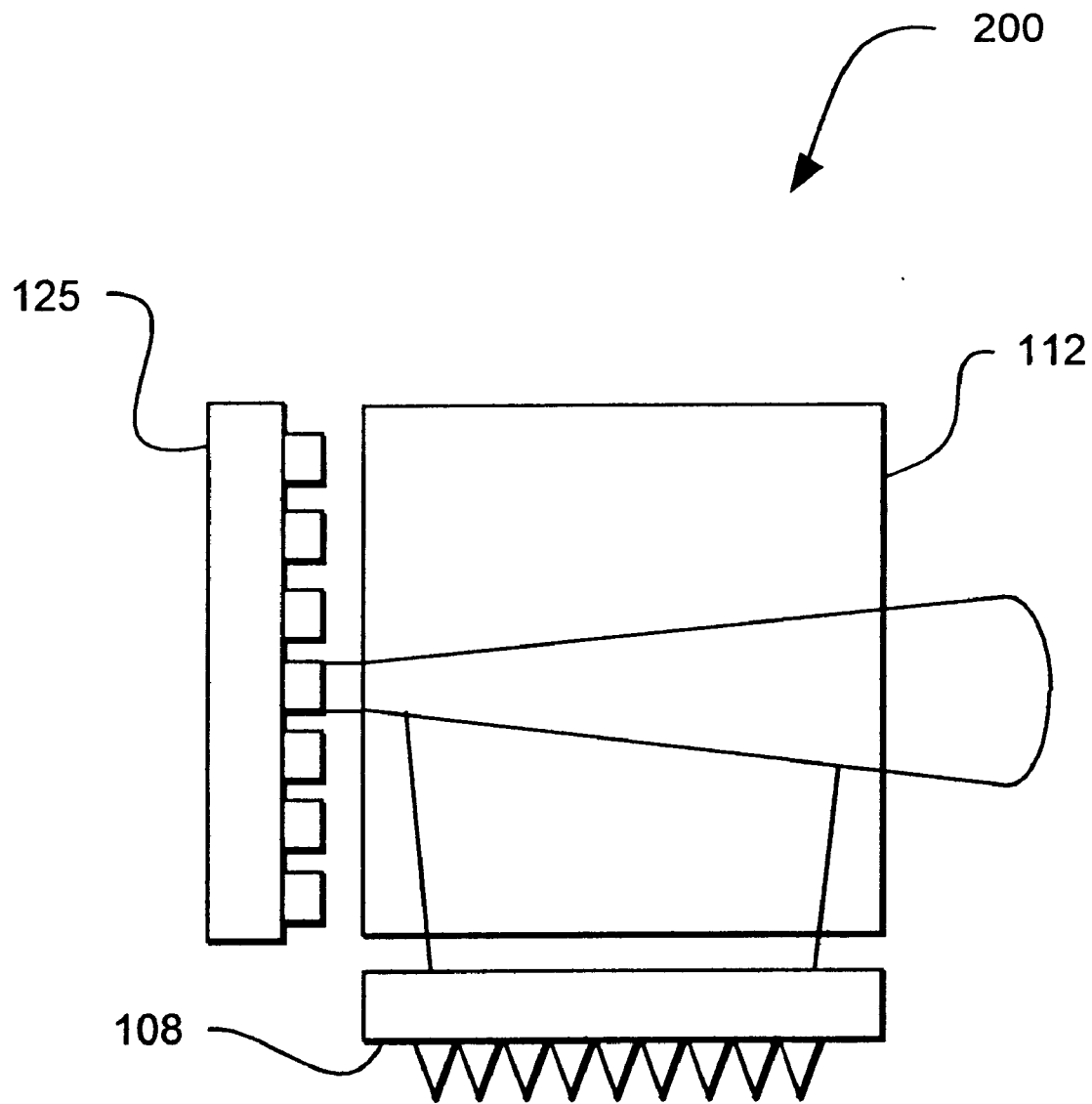
FIG. 3 illustrates one apparatus in the present invention transferring configuration data in a hologram into an FPGA.

FIG. 3 shows an apparatus 200 to transfer configuration data in holograms into an FPGA. With the holograms generated between the lens 104 and the image plane 110, the apparatus 200 to transfer configuration data does not need a lens. Configuration data can be transferred from the holograms to the detectors on the FPGA through an array 125 of laser diodes. Each diode acts as a point source to simulate the spherical waves used during the recording. One can select any one of the pre-stored holograms by turning on its corresponding laser diode. One advantage of using the laser diode array, such as a vertical cavity surface emitting laser diodes array, is the fast access time. These diodes can be switched on and off in several nanoseconds. The time to access a set of reconfiguration data or the reconfiguration time is limited by the integration time of the optical detectors. In one embodiment, with several hundred holograms stored, the reconfiguration time is in the order of several micro-seconds.

The crystal 112, the FPGA 108 and the array 125 of laser diodes can be integrated together as a compact package. To ensure the alignment of the holograms and the FPGA detectors, one approach is to integrate the package by first gluing the crystal 112 on top of the FPGA 108, and then gluing the laser diode array 125 on the crystal. During each gluing step, the responses of the detectors on the FPGA are monitored. Based on the teachings in the present application, such fabrication process should be obvious to those skilled in the art and will not be further described.

In one embodiment, with more than one hundred pages of reconfiguration data stored in holograms, and with about a million bits per page, the reconfiguration time for a page of reconfiguration data is just about 30 micro-seconds.

Figure 4:
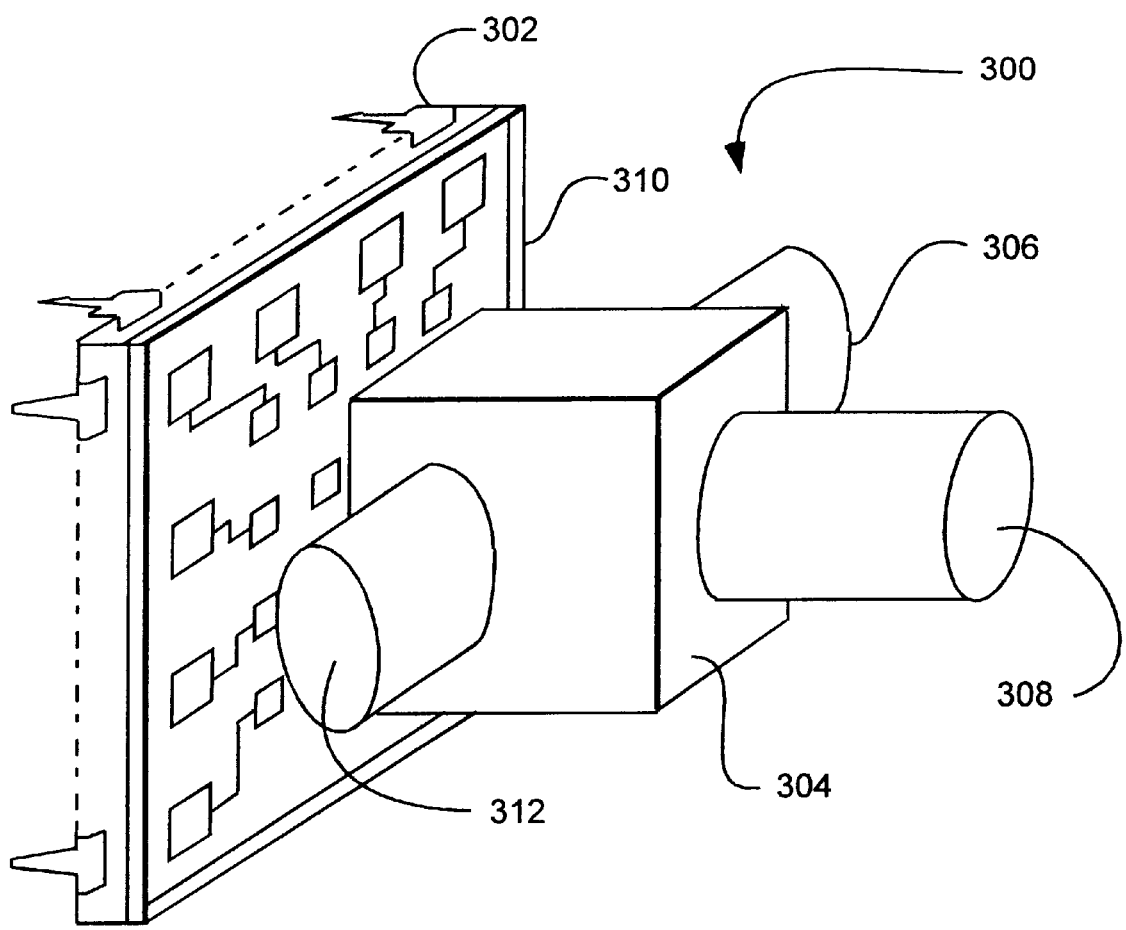
FIG. 4 illustrates another apparatus in the present invention to record and transfer configuration data into an FPGA based on conjugate reference beams.

FIG. 4 illustrates another apparatus 300 to record and transfer configuration data into an FPGA 302 based on conjugate reference beams. The idea of using conjugate beams in holograms can be found, for example, in the publication, entitled, "Integrated Optoelectronic Interconnects Using Liquid-Crystal-on-Silicon VLSI," written by Drolet et. al., published in pages 106–131 of the SPIE Proceedings CR62: Optoelectronic Interconnects and Packaging, on January, 1996.

As shown in FIG. 4, in the apparatus 300, a SLM 310 is positioned on the top surface of the FPGA 302. This can be done through thin-film processes known to those skilled in the art. During the recording of holograms, the SLM carries one page of configuration data; a reference beam 306 is incident on one surface, such as the left surface, of the crystal; and an object beam 308 is incident on an orthogonal surface, such as the top surface, of the crystal 304. The object beam 308 reflected from the SLM 310 interferes with the reference beam 306 to form a hologram in the crystal.

To reconstruct the reconfiguration page for the FPGA 302, a conjugate beam is incident on a surface of the crystal that is opposite to the incident surface of the reference beam, such as the right surface, of the crystal. With the SLM turned transparent, reconfiguration data will be transferred to the optical detectors on the FPGA 302.

The present invention illustrates the use of holograms to transfer reconfiguration data into FPGAs that incorporate optical detectors. The same approach can be applied to other types of more simple or complex programmable logic devices. Also other optical approaches can be used; for example, one can use an LED array to directly transfer reconfiguration data to individual optical detectors, or one can map information represented on a SLM onto individual optical detectors.

Other embodiments of the invention will be apparent to those skilled in the art from a consideration of this specification or practice of the invention disclosed herein. It is intended that the specification and examples be considered as exemplary only, with the true scope and spirit of the invention being indicated by the following claims.

We claim:

1. A method to reconfigure a programmable logic device with a plurality of configurable elements, the method comprising the steps of:

retrieving reconfiguration data pre-stored in a memory device located apart from the programmable logic device; and transferring optically the retrieved reconfiguration data in parallel to a plurality of the configurable elements for reconfiguring the programmable logic device.

2. A method as recited in claim 1 wherein the step of retrieving and the step of transferring can be combined into a single process.

3. A method as recited in claim 1 wherein the programmable logic device includes a plurality of optical detectors to receive the reconfiguration data for the configurable elements.

4. A method as recited in claim 1 wherein the step of transferring depends on an array of light sources.

5. A method as recited in claim 1 wherein the memory device includes an optical memory device.

6. A method as recited in claim 5 wherein the optical memory device includes a holographic medium with a hologram for storing at least some of the reconfiguration data.

7. A method as recited in claim 6 wherein the holographic medium includes a plurality of multiplexed holograms for storing at least some of the reconfiguration data.

8. A method as recited in claim 5 wherein the memory device and the programmable logic device are integrated as a package.

9. A method as recited in claim 5 wherein the step of transferring depends on an array of light sources.

10. A method as recited in claim 9 wherein the array of light sources, the memory device and the programmable logic device are integrated as a package.

11. A method as recited in claim 6 wherein the step of transferring depends on a conjugate reference beam.

12. An apparatus to reconfigure a programmable logic device with a plurality of configurable elements, the apparatus comprising:
   a memory device, located apart from the programmable logic device, configured to store reconfiguration data; and
   a transferor configured to retrieve reconfiguration data pre-stored in the memory device, and to optically transfer the retrieved reconfiguration data in parallel to a plurality of the configurable elements for reconfiguring the programmable logic device.

13. An apparatus as recited in claim 12 wherein the programmable logic device includes a plurality of optical detectors to receive the reconfiguration data for the configurable elements.

14. An apparatus as recited in claim 12 wherein the transferor further comprises an array of light sources.

15. An apparatus as recited in claim 12 wherein the memory device includes an optical memory device.

16. An apparatus as recited in claim 15 wherein the optical memory device includes a holographic medium with a hologram for storing at least some of the reconfiguration data.

17. An apparatus as recited in claim 16 wherein the holographic medium includes a plurality of multiplexed holograms for storing at least some of the reconfiguration data.

18. An apparatus as recited in claim 15 further comprising the programmable logic device, which integrates with the memory device as a package.

19. An apparatus as recited in claim 15 wherein the transferor further comprises an array of light sources.

20. An apparatus as recited in claim 19 further comprising the programmable logic device, which integrates with the memory device and the array of light sources as a package.

21. An apparatus as recited in claim 16 wherein the transferor depends on a conjugate reference beam.

* * * * *